(12) United States Patent
Cannon et al.

(10) Patent No.: US 7,385,275 B2
(45) Date of Patent: Jun. 10, 2008

(54) SHALLOW TRENCH ISOLATION METHOD FOR SHIELDING TRAPPED CHARGE IN A SEMICONDUCTOR DEVICE

(75) Inventors: Ethan Harrison Cannon, Essex Junction, VT (US); Shunhua Thomas Chang, South Burlington, VT (US); Toshiharu Furukawa, Essex Junction, VT (US); David Vaclav Horak, Essex Junction, VT (US); Charles William Koburger, III, Delmar, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/276,132

(22) Filed: Feb. 15, 2006

(65) Prior Publication Data

US 2007/0187778 A1    Aug. 16, 2007

(51) Int. Cl.
 *H01L 29/00* (2006.01)
 *H01L 21/762* (2006.01)
 *H01L 21/763* (2006.01)
(52) U.S. Cl. .............................. 257/520; 257/E21.545; 257/E21.585; 257/545; 257/547
(58) Field of Classification Search ................ 257/520, 257/545, 547, E21.545, E21.585
See application file for complete search history.

(56) References Cited

U.S. PATENT DOCUMENTS 4,666,556 A    5/1987   Fulton et al.
4,884,117 A *  11/1989  Neppl et al. ................. 257/370
5,028,556 A    7/1991   Chang
5,759,907 A    6/1998   Assaderaghi et al.
5,879,954 A    3/1999   Chang et al.
5,923,073 A *  7/1999   Aoki et al. ................... 257/501
6,008,104 A    12/1999  Schrems
6,890,832 B1   5/2005   Kerwin et al.
2003/0036236 A1  2/2003  Benedetto et al.
2005/0176197 A1  8/2005  Weis et al.

* cited by examiner

*Primary Examiner*—Matthew C. Landau
*Assistant Examiner*—Michael Durbin
(74) *Attorney, Agent, or Firm*—Schmeiser, Olsen & Watts; William D. Sabo

(57) ABSTRACT

A semiconductor structure and associated method for forming the semiconductor structure. The semiconductor structure comprises a first field effect transistor (FET), a second FET, and a shallow trench isolation (STI) structure. The first FET comprises a channel region formed from a portion of a silicon substrate, a gate dielectric formed over the channel region, and a gate electrode comprising a bottom surface in direct physical contact with the gate dielectric. A top surface of the channel region is located within a first plane and the bottom surface of the gate electrode is located within a second plane. The STI structure comprises a conductive STI fill structure. A top surface of the conductive STI fill structure is above the first plane by a first distance $D_1$ and is above the second plane by a second distance $D_2$ that is less than $D_1$.

13 Claims, 12 Drawing Sheets

SHALLOW TRENCH ISOLATION METHOD FOR SHIELDING TRAPPED CHARGE IN A SEMICONDUCTOR DEVICE

BACKGROUND OF THE INVENTION

1. Technical Field

The present invention relates to a structure and method to shield a trapped charge from devices within a semiconductor structure.

2. Related Art

Unwanted electrical charges within an electrical structure may cause devices within the electrical structure to malfunction. Therefore there is a need for protecting devices within an electrical structure from the affects of unwanted electrical charges.

SUMMARY OF THE INVENTION

The present invention provides a semiconductor structure, comprising:
  a first field effect transistor (FET) comprising a channel region formed from a portion of a silicon substrate, a source structure formed adjacent to said channel region, a drain structure formed adjacent to said channel region, a gate dielectric formed over said channel region, and a gate electrode formed over said gate dielectric, wherein a bottom surface of said gate electrode is in direct physical contact with said gate dielectric, wherein said channel region comprises a first corner device and a second corner device, wherein a top surface of said channel region is located within a first plane, and wherein said bottom surface of said gate electrode is located within a second plane;
  a second FET; and
  a shallow trench isolation (STI) structure located adjacent to said channel region, wherein said STI structure isolates said first FET from said second FET, wherein said STI structure comprises a dielectric liner formed in a trench within said silicon substrate, a conductive STI fill structure formed over said dielectric layer, and a dielectric cap layer formed over and in contact with a top surface of said conductive STI fill structure, wherein said top surface of said conductive STI fill structure is above said first plane by a first distance $D_1$ and is above said second plane by a second distance $D_2$ that is less than $D_1$.

The present invention provides method for forming a semiconductor structure, comprising:
  providing a silicon substrate;
  forming, within said a silicon substrate, a shallow trench isolation (STI) structure comprising a dielectric liner formed in a trench within said silicon substrate, a conductive STI fill structure formed over said dielectric layer, and a dielectric cap layer formed over and in contact with a top surface of said conductive STI fill structure;
  forming within said bulk silicon substrate, a first field effect transistor (FET) and a second FET, wherein said first FET comprises a channel region formed from a portion of said silicon substrate, a source structure formed adjacent to said channel region, a drain structure formed adjacent to said channel region, a gate dielectric formed over said channel region, and a gate electrode formed over said gate dielectric, wherein a bottom surface of said gate electrode is in direct physical contact with said gate dielectric, wherein said channel region comprises a first corner device and a second corner device, wherein a top surface of said channel region is located within a first plane, wherein said bottom surface of said gate electrode is located within a second plane, wherein said shallow trench isolation (STI) structure located adjacent to said channel region, wherein said STI structure isolates said first FET from said second FET, wherein said top surface of said conductive STI fill structure is above said first plane by a first distance $D_1$ and is above said second plane by a second distance $D_2$ that is less than $D_1$.

The present invention advantageously provides a system and associated method for protecting devices within an electrical structure from the affects of unwanted electrical charges.

DETAILED DESCRIPTION OF THE INVENTION

Figure 1:
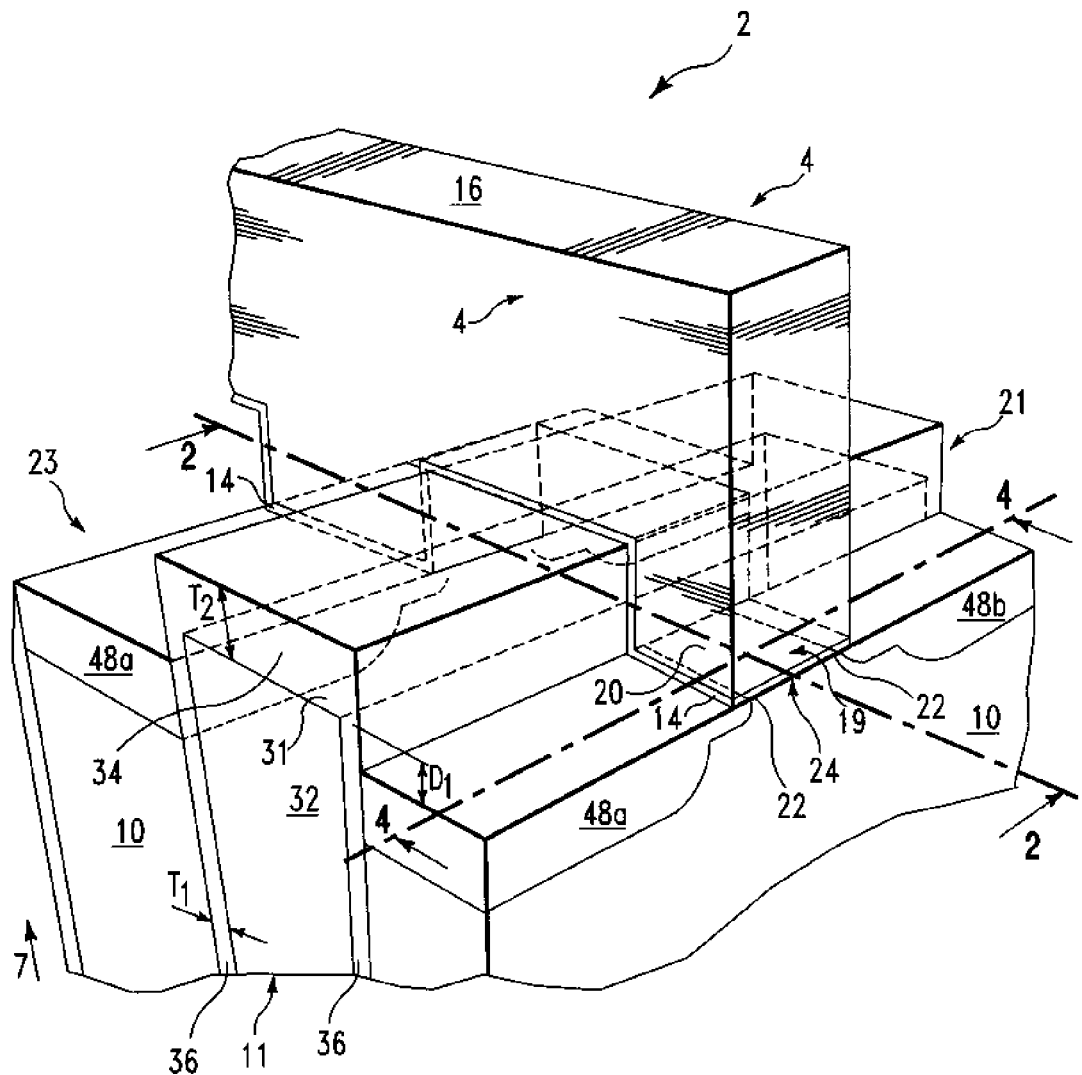
FIG. 1 illustrates a perspective view of a semiconductor structure 2 comprising a shallow trench isolation (STI) structure, in accordance with embodiments of the present invention.

FIG. 1 illustrates a perspective view of a semiconductor structure 2 comprising a shallow trench isolation (STI) structure 11, in accordance with embodiments of the present invention. The semiconductor structure 2 comprises a silicon substrate 10, a field effect transistor (FET) 21, a FET 23 (only partially shown in FIG. 1), and the STI structure 11 (i.e., comprising a dielectric liner 36, a conductive STI fill structure 32, and a dielectric cap structure 34). The STI structure 11 is located within a trench (i.e., see trench 40 in FIG. 5B) formed in the silicon substrate 10 between the FET 21 and the FET 23. The STI structure 11 physically and electrically isolates the FET 21 from the FET 23. The following description of FET 21 also applies to FET 23. The FET 21 comprises a source structure 48a, a drain structure 48b, a gate dielectric layer 14, a shared gate electrode 16 (i.e., the gate electrode 16 is shared by the FET 21 and the FET 23), and a channel region 24. The channel region 24 is formed from a portion of the silicon substrate 10 and is located between the source structure 48a and the drain structure 48b. The channel region 24 provides a conductive path (i.e., controlled by the gate electrode 16) between the source structure 48a and the drain structure 48b. The channel region 24 comprises corner devices 22. The corner devices 22 are defined as edge sections of the channel region 24. The corner devices 22 are parasitic devices comprising slightly different physical and electrical characteristics than a central portion 19 of the channel region 24.

Semiconductor structures (e.g., semiconductor structure 2) may be used (operated) in any type of circuitry. During operation of semiconductor structures over a period of time, an unwanted electrical charge buildup 26 (see FIG. 2) in dielectric regions of STI structure may be caused when operating the semiconductor structure within circuits in certain environments. For example, when a semiconductor structure is operated over a period of time in circuitry within a radiation environment (e.g., satellite circuitry, circuitry in a nuclear power plant, etc.), radiation (e.g., from a solar burst, from nuclear power plant facilities, etc) may cause a trapped electrical charge build up to form within dielectric regions of STI structure within the semiconductor device. If the dielectric regions of the STI structure are located near FET channel regions (e.g., channel region 24), the trapped electrical charge build up in the STI structure may cause corner devices (e.g., corner devices 22) to turn on thereby increasing source to drain leakage currents which in turn may cause the semiconductor structure (i.e., the FETS within the semiconductor structure) to malfunction and ultimately fail. Therefore, the semiconductor structure 2 of FIG. 1 provides an STI structure 11 that shields the corner devices 22 within the channel region 24 from any an unwanted electrical charge buildup within the STI structure 11 (i.e., within the dielectric cap structure 34).

The STI structure 11 of FIG. 1 comprises a dielectric liner 36, a conductive STI fill structure 32, and a dielectric cap structure 34. The dielectric liner 36 lines a formed trench (e.g., see trench 40 in FIG. 5B) and the conductive STI fill structure 32 is formed over and in contact with the dielectric liner 36. The dielectric cap structure 34 is formed over a top surface 31 of the conductive STI fill structure 32. The dielectric liner 36 and the dielectric cap structure 34 may comprise, inter alia, silicon dioxide. The conductive STI fill structure 32 may comprise, inter alia, doped polysilicon. The dielectric liner 36 may comprise a thickness $T_1$ of about 2 nanometers (nm) to about 20 nm. The dielectric cap structure 34 may comprise a thickness $T_2$ of about 20 nm to about 100 nm. A top surface 20 of the channel region 24 resides in a first plane. During operation (i.e., over a period of time) of the of the semiconductor structure 2 in certain environments (e.g., a radiation environment such as, inter alia, satellite circuitry, circuitry in a nuclear power plant, etc.), an unwanted electrical charge buildup 26 (i.e., see FIG. 2) may be found within the dielectric cap structure 34. No such charge buildup is possible in conductive materials, such as that employed for the conductive STI fill structure 32. If the electrical charge buildup 26 within the dielectric cap structure 34 occurs near the channel region 24, the electrical charge buildup 26 could cause the corner devices 22 to turn on thereby increasing source structure 48a to drain structure 48b leakage currents which in turn may cause the semiconductor structure 2 (i.e., the FETS 21 and 23) to malfunction and ultimately fail. Therefore, the STI structure 11 is formed such that the top surface 31 of the conductive STI fill structure 32 is raised a specified distance ($D_1$) above (i.e., with respect to direction 7) the first plane. As a result of the above mentioned configuration (i.e., the raised top surface 31), the dielectric cap structure 34 (i.e., formed on the top surface 31 of the conductive STI fill structure 32) is also raised above the first plane so that the dielectric cap structure 34 is not adjacent to the channel region 24. The conductive STI fill structure 32 shields the corner devices 22 from any electrical charge 26 buildup within the dielectric cap structure 34 thereby preventing damage to the FETS 21 and 23.

The top surface 31 of the conductive STI fill structure extends above first plane (and the top surface 20 of the channel region 24) by a distance $D_1$ that is about 1.5 to about 4 times the thickness $T_1$ of the dielectric liner 36. The distance $D_1$ may be selected from a range of about 5 nanometers to about 80 nm nanometers.

Figure 2:
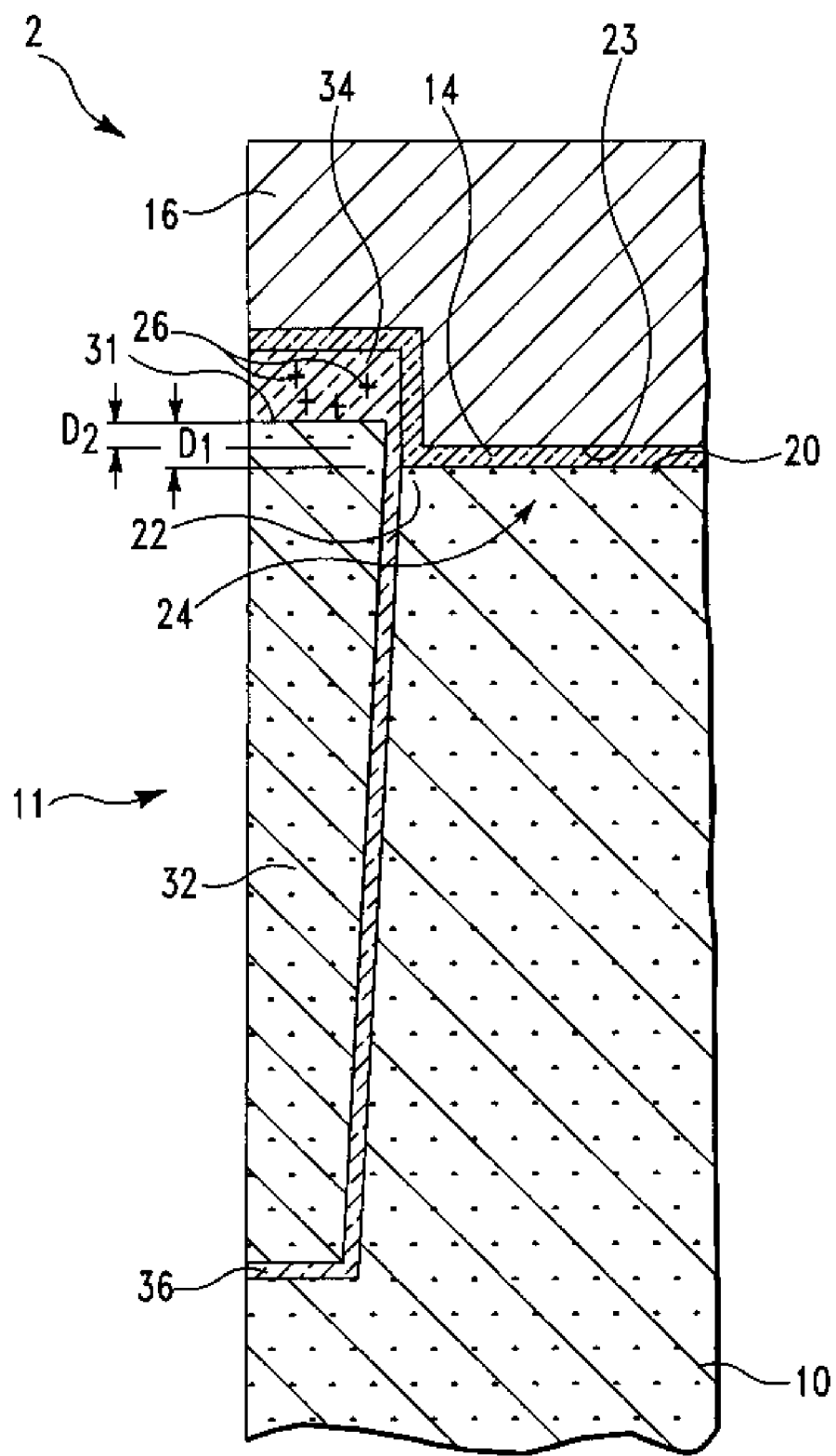
FIG. 2 illustrates a first cross sectional view of the semiconductor structure of FIG. 1, in accordance with embodiments of the present invention.

FIG. 2 illustrates a first cross sectional view of the semiconductor structure 2 of FIG. 1, in accordance with embodiments of the present invention. The first cross sectional view of FIG. 2 is taken along line 2-2 of FIG. 1. FIG. 2 clearly illustrates the distance $D_1$ (i.e., as described in the description of FIG. 1) and the unwanted charge build up 26 within the dielectric cap structure 34. Additionally, FIG. 2 illustrates a distance $D_2$. The distance $D_2$ represents a distance that the top surface 31 of the conductive STI fill structure 32 is raised above (i.e., with respect to direction 7) a second plane (i.e., a bottom surface 23 of the gate electrode 16 resides in the second plane). The distance $D_1$ is greater than the distance $D_2$.

Figure 3:
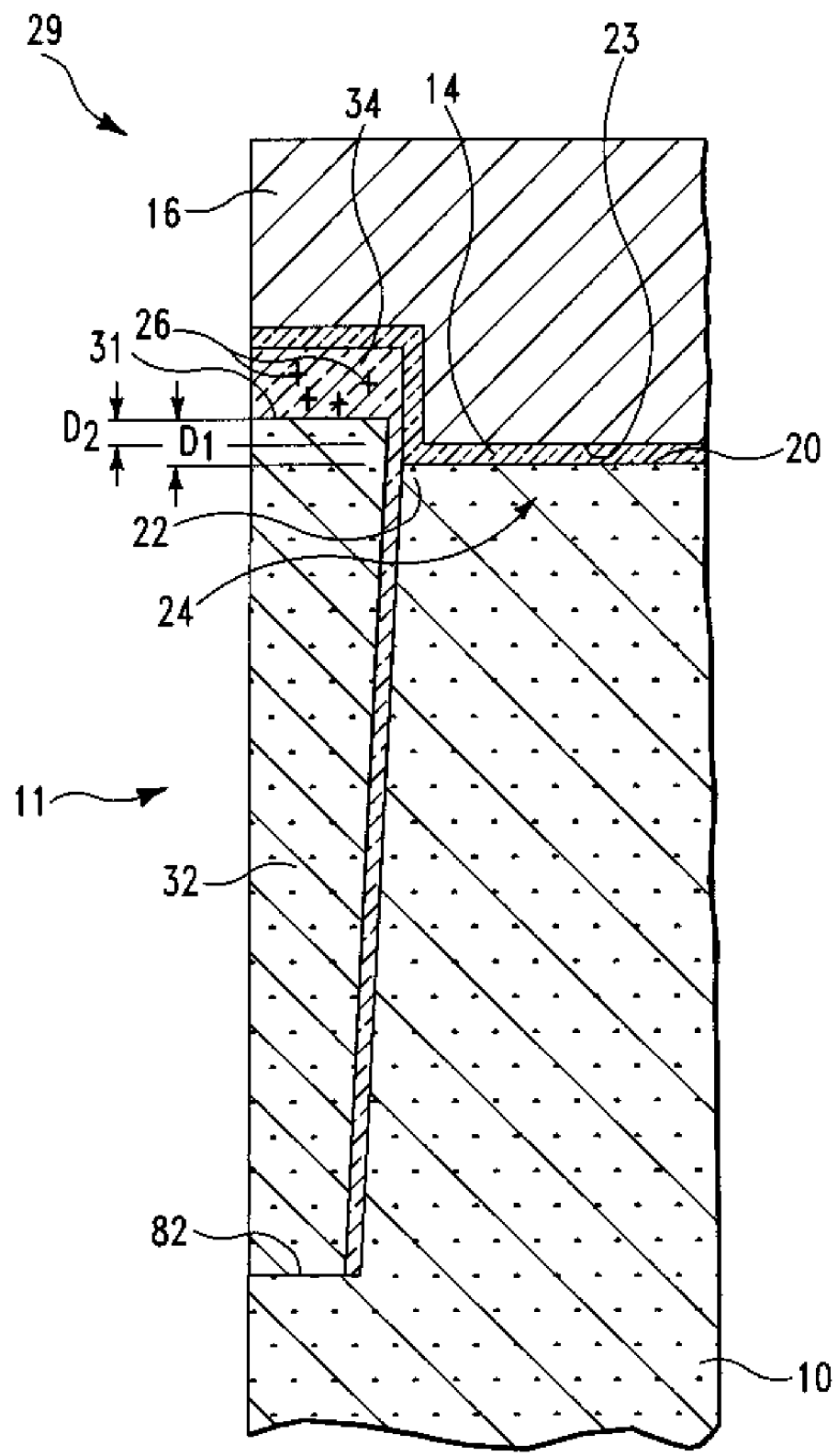
FIG. 3 illustrates an alternative to the semiconductor structure 2 of FIG. 2, in accordance with embodiments of the present invention.

FIG. 3 illustrates an alternative to the semiconductor structure 2 of FIG. 2, in accordance with embodiments of the present invention. In contrast to the semiconductor structure 2 of FIG. 2, the semiconductor structure 2a of FIG. 3 comprises electrical connections 82 between the conductive STI fill structure 32 and the silicon substrate 10. A portion of the dielectric liner 36 has been removed prior to formation of conductive STI fill structure 32 so that the conductive STI fill structure 32 may be electrically connected to the silicon substrate 10. The electrical connections 82 will prevent electrical floating of the conductive STI fill structure 32 without necessitating any additional top-side connections.

Figure 4:
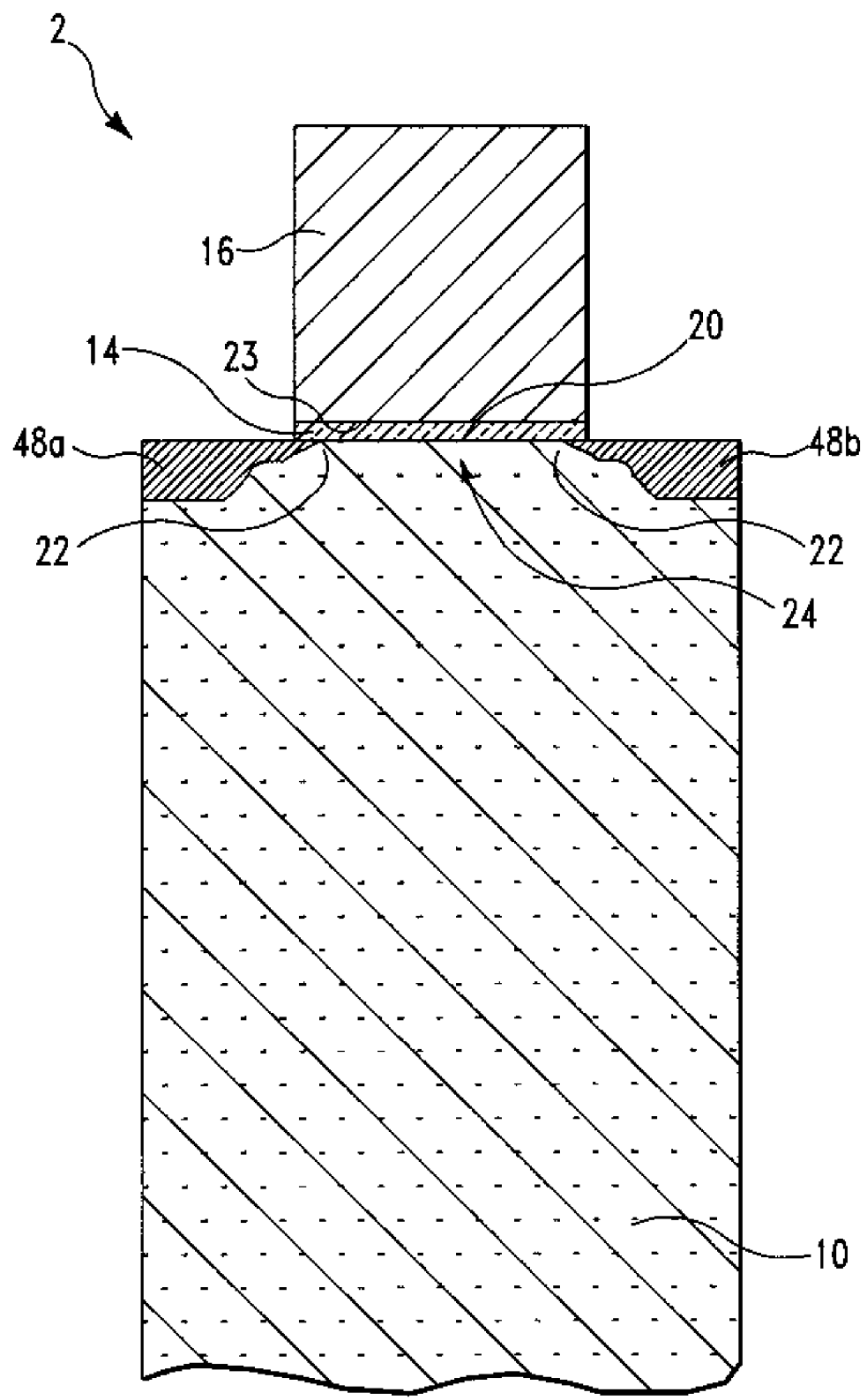
FIG. 4 illustrates a second cross sectional view of the semiconductor structure of FIG. 1, in accordance with embodiments of the present invention.

FIG. 4 illustrates a second cross sectional view of the semiconductor structure 2 of FIG. 1, in accordance with embodiments of the present invention. The second cross sectional view of FIG. 2 is taken along line 4-4 of FIG. 1.

FIG. 5A-5F illustrate a cross sectional view of a forming method and structure for forming a semiconductor structure 2 of FIGS. 1 and 2, in accordance with embodiments of the present invention.

Figure 5A:
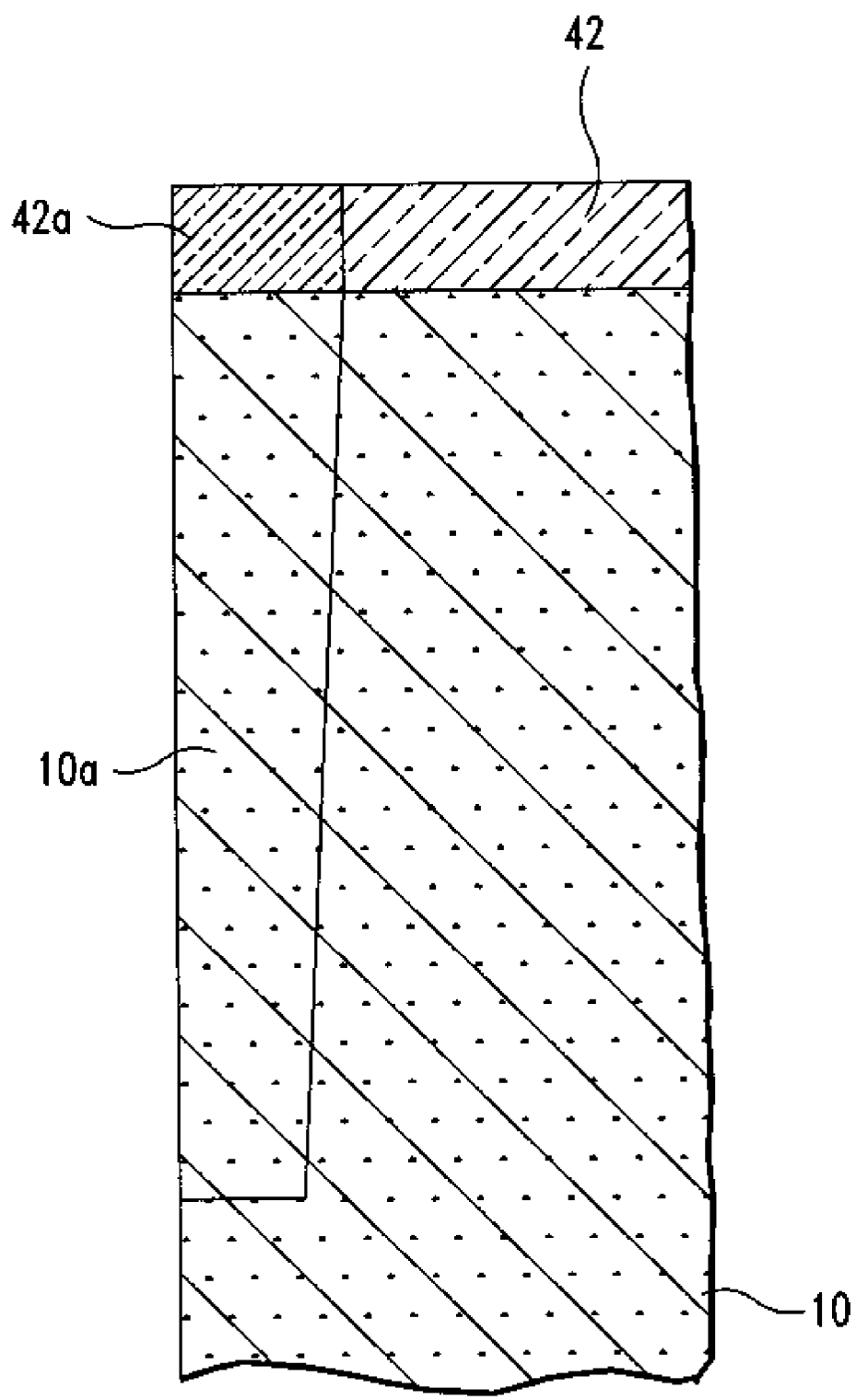
FIG. 5A-5G illustrate a cross sectional view of a forming method and structure for forming a semiconductor structure of FIGS. 1 and 2, in accordance with embodiments of the present invention.

FIG. 5A illustrates the silicon substrate 10 comprising a pad structure 42, in accordance with embodiments of the present invention. The pad structure 42 may comprise, inter alia, a pad oxide layer and a pad nitride layer. Portion 10a of the silicon substrate 10 and portion 42a of the pad structure 42 comprise portions that will be removed in order to form the shallow isolation trenches 40 of FIG. 5B.

Figure 5B:
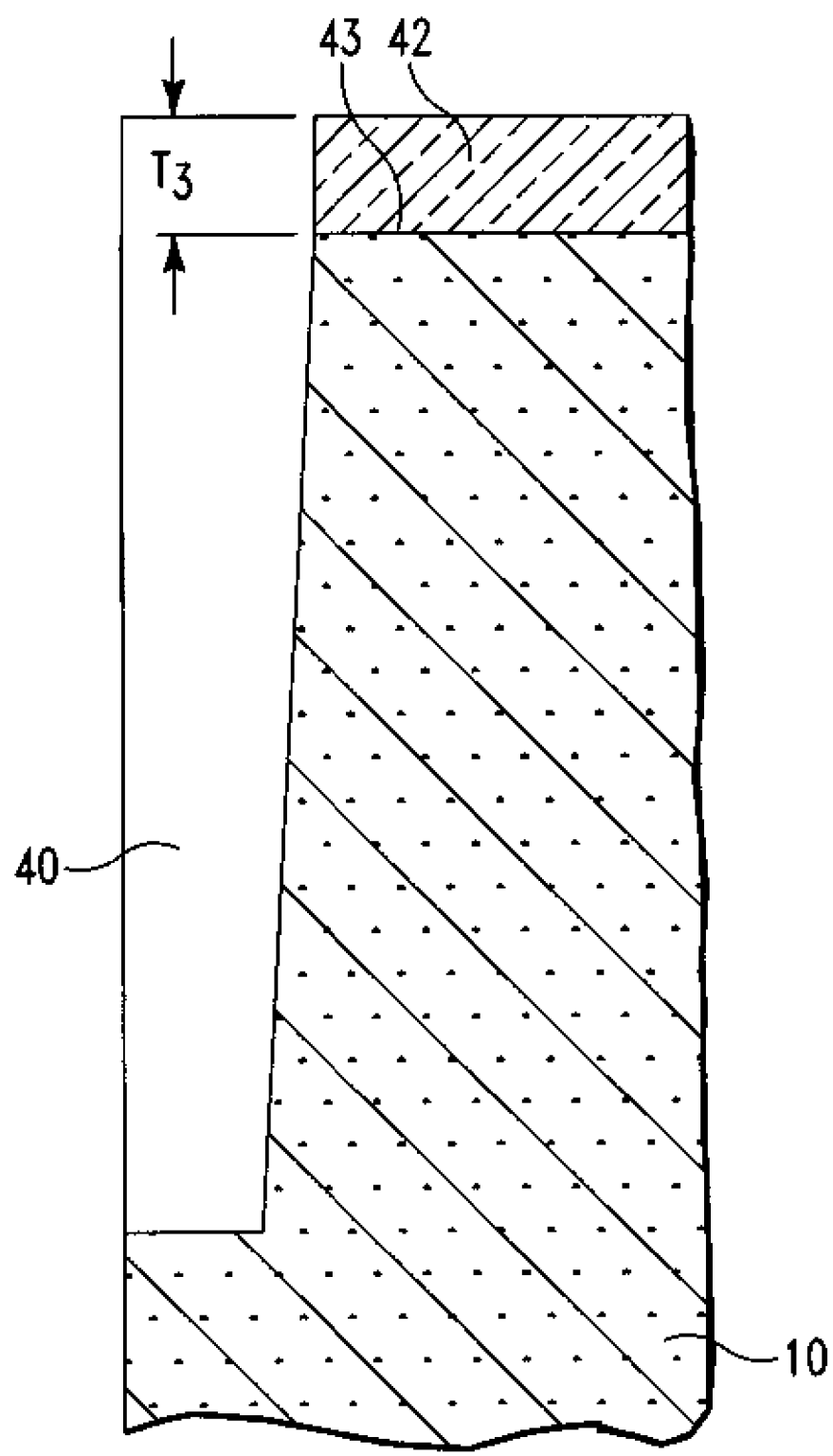

FIG. 5B illustrates a formed shallow trench 40 within the silicon substrate 10, in accordance with embodiments of the present invention. A masking/etching process is used to form the shallow isolation trenches 40. Any masking/etching process using standard lithographic techniques known to a person of ordinary skill in the art may be used. The masking/etching process removes the portion 42a (i.e., from FIG. 5A) of the pad structure 42 and portion 10a (i.e., from FIG. 5A) of the silicon substrate 10. The pad structure 42 may be processed to a thickness $T_3$ such that after a planarization process, the conductive STI fill structure 32 will be above a top surface 43 of the silicon substrate 10 by a minimum amount. Note that surface 43 of the silicon substrate 10 will become surface 20 of the channel region 24.

Figure 5C:
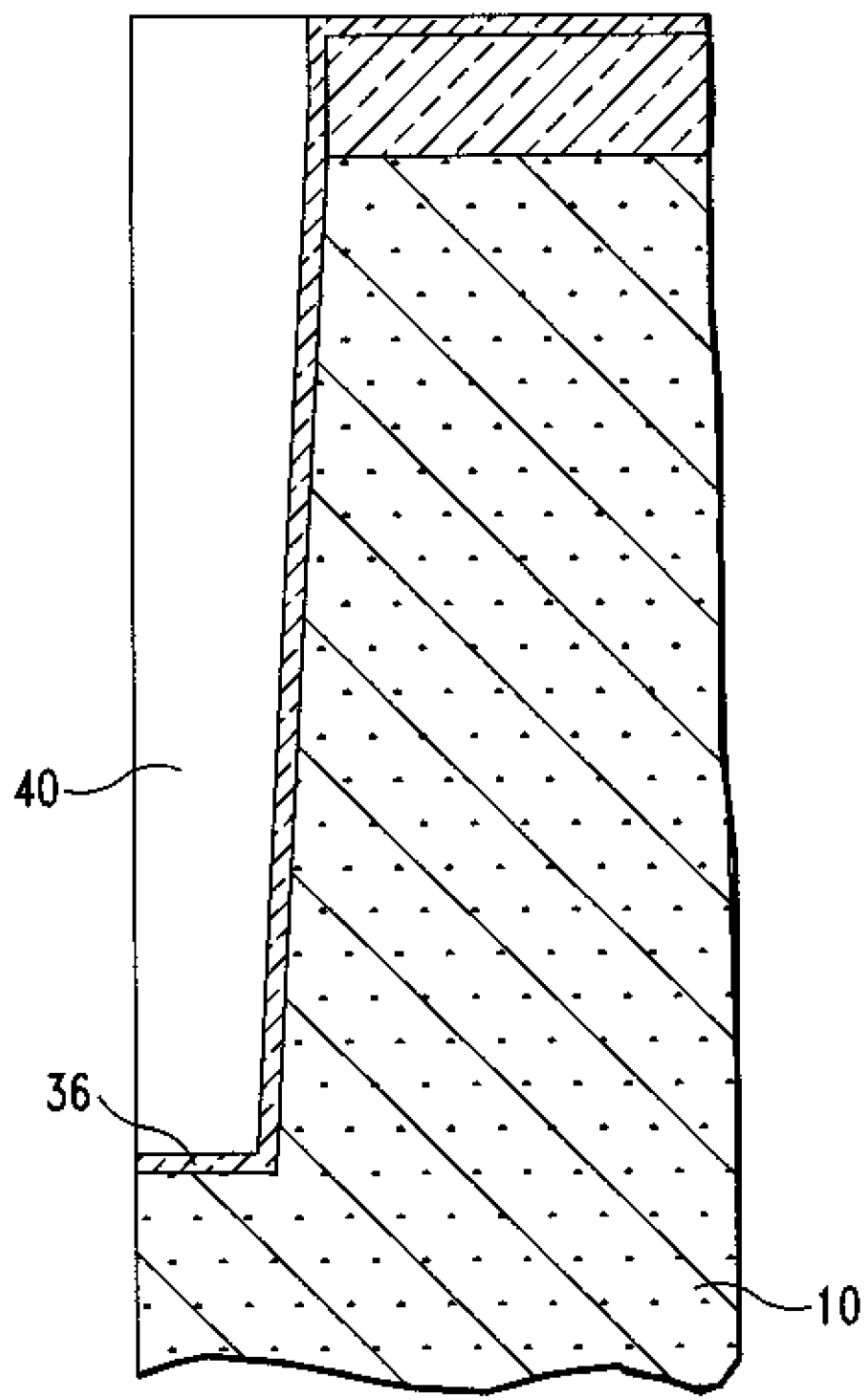

FIG. 5C illustrates a formation of the dielectric liner 36, in accordance with embodiments of the present invention. The shallow isolation trenches 40 are lined with the dielectric liner 36. The dielectric liner 36 may comprise, inter alia, silicon dioxide. The dielectric liner 36 may be formed as a thermally-grown silicon dioxide, using a chemical vapor deposition (CVD) process to deposited silicon dioxide, or any combination thereof. The dielectric liner 36 may be formed comprising a thickness of about 3 nm to about 20 nm.

Figure 5D:
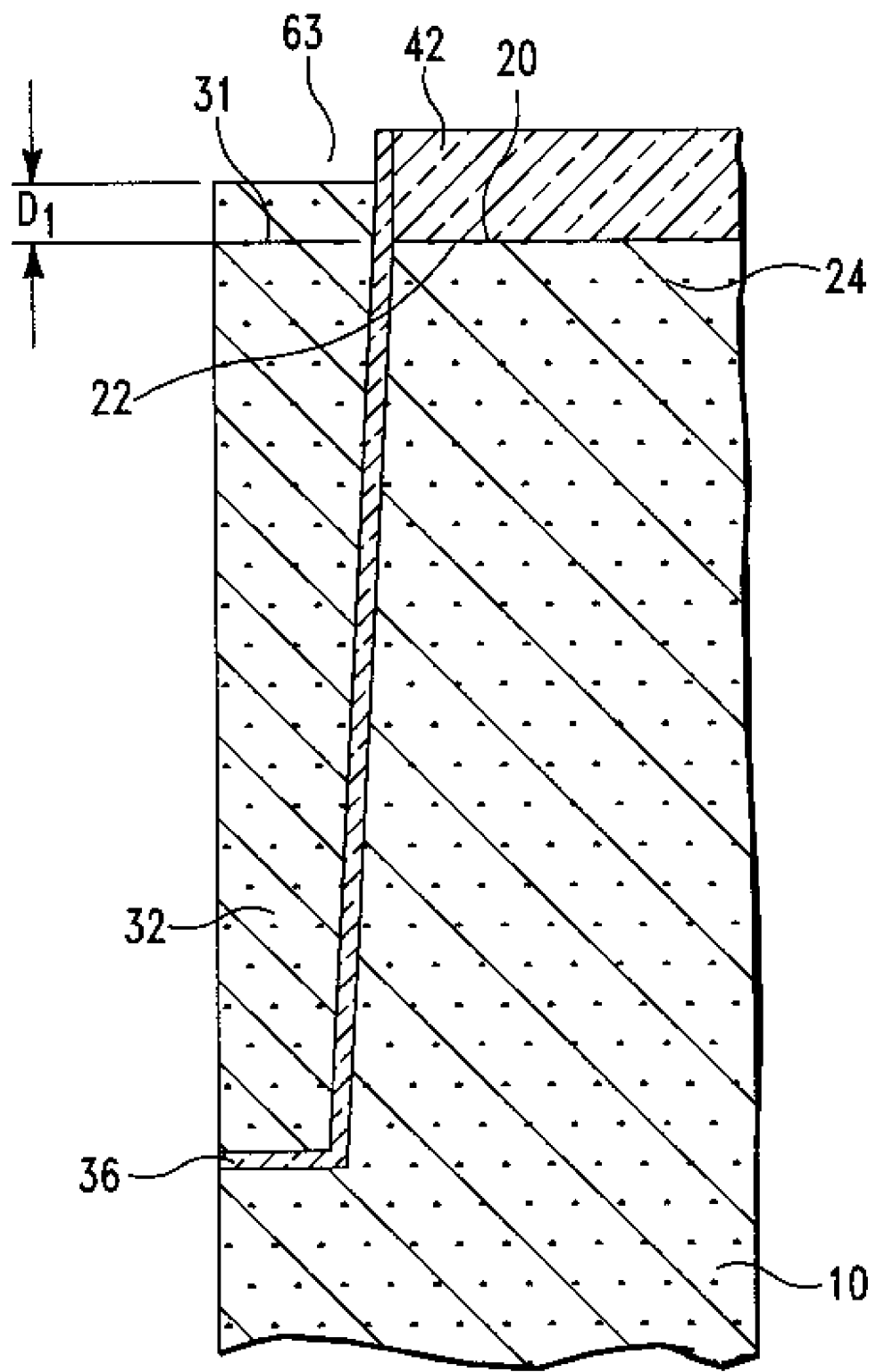

FIG. 5D illustrates a formation of the conductive STI fill structure 32, in accordance with embodiments of the present invention. The conductive STI fill structure 32 is formed within the remaining portion of the shallow isolation trench 40 (i.e., after the dielectric liner 36 has been formed). Material for conductive the STI fill structure 32 (e.g., doped polysilicon) is deposited over the entire structure, then planarized to the top of pad structure 42, using a known process such as, inter alia, chemical-mechanical polishing, etc. A recess 63 is then formed within the conductive STI fill structure 32 such that the surface 31 of the conductive STI fill structure 32 extends above the top surface 20 of the channel region 24 (i.e., within the silicon substrate 10) by the distance $D_1$ that is about 1.5 to about 4 times the thickness $T_1$ of the thin dielectric liner 36.

Figure 5E:
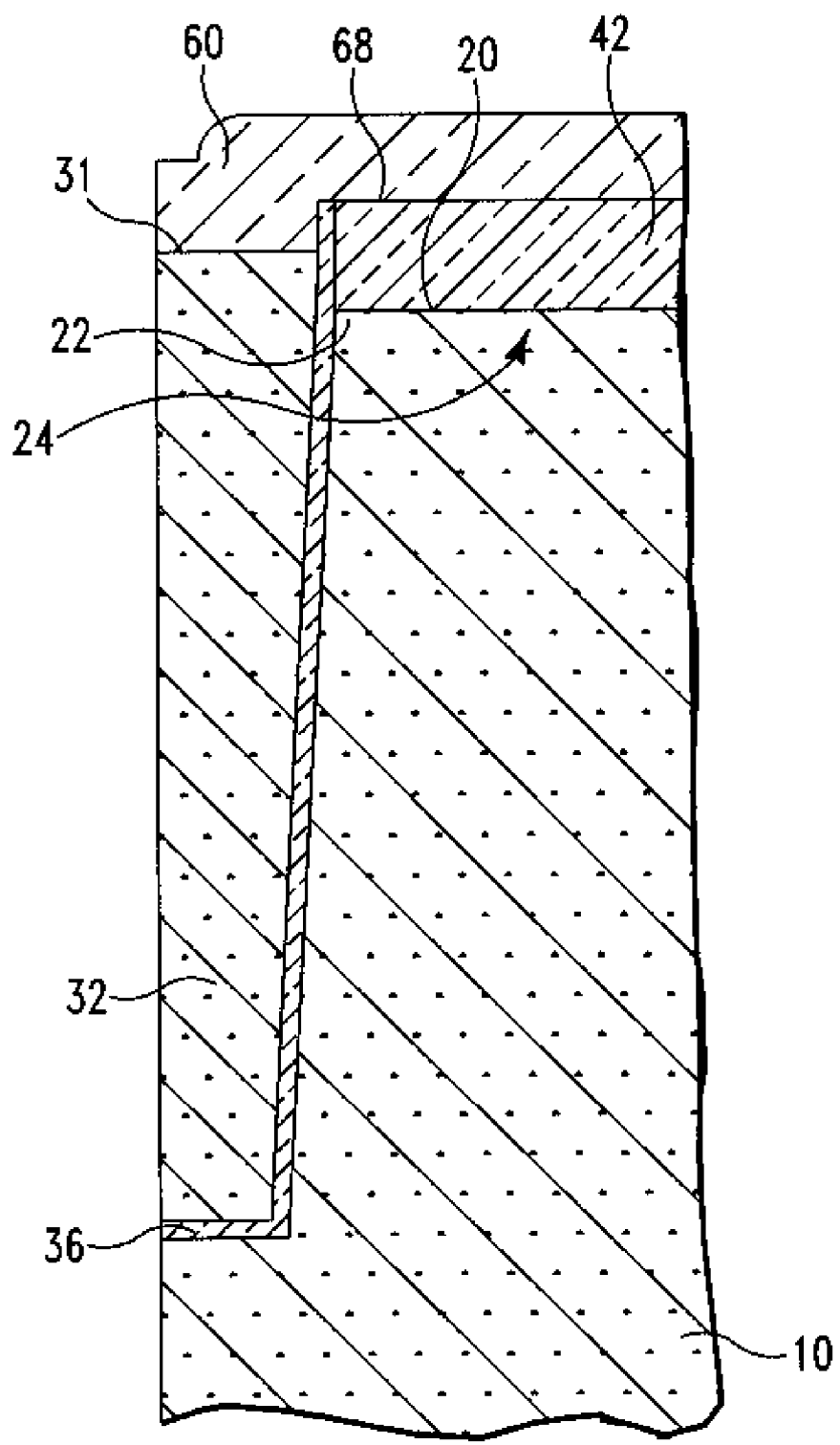

FIG. 5E illustrates a first formation step for forming the dielectric cap structure 34 of FIGS. 1 and 2, in accordance with embodiments of the present invention. A cap dielectric layer 60 is formed within the recess 63 (see FIG. 5D) and over a top surface 68 of the pad structure 42. The cap dielectric layer 60 may comprise, inter alia, silicon dioxide. The cap dielectric layer 60 may be formed using any technique known to a person of ordinary skill in the art including, inter alia, a CVD process.

Figure 5F:
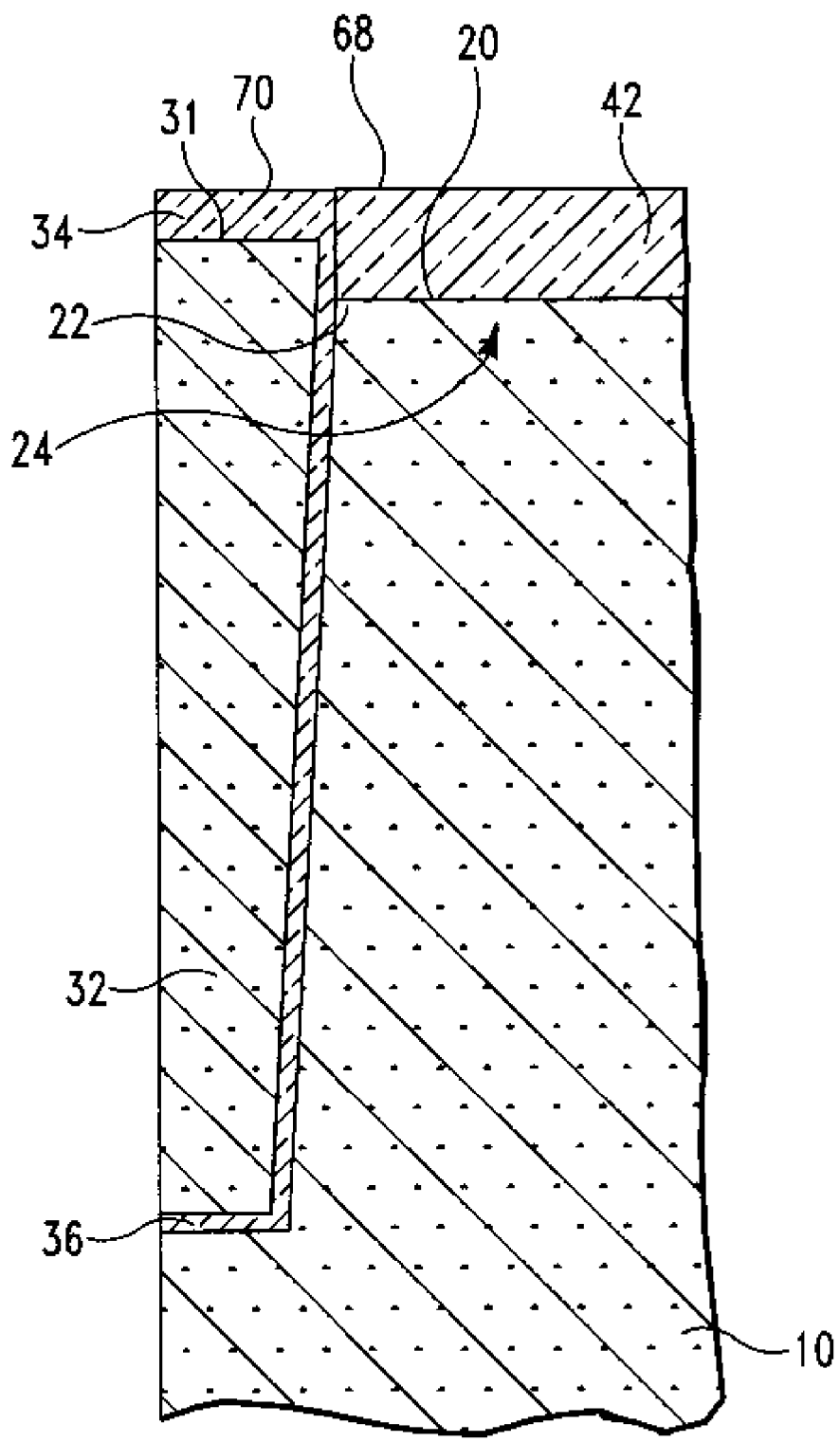

FIG. 5F illustrates a second formation step for forming the dielectric cap structure 34 of FIGS. 1 and 2, in accordance with embodiments of the present invention. A portion of the cap dielectric layer 60 is removed and the resulting dielectric cap structure 34 is planerized such that a top surface 70 of the dielectric cap structure 34 is coplanar with the top surface 68 of the pad structure 42.

Figure 5G:
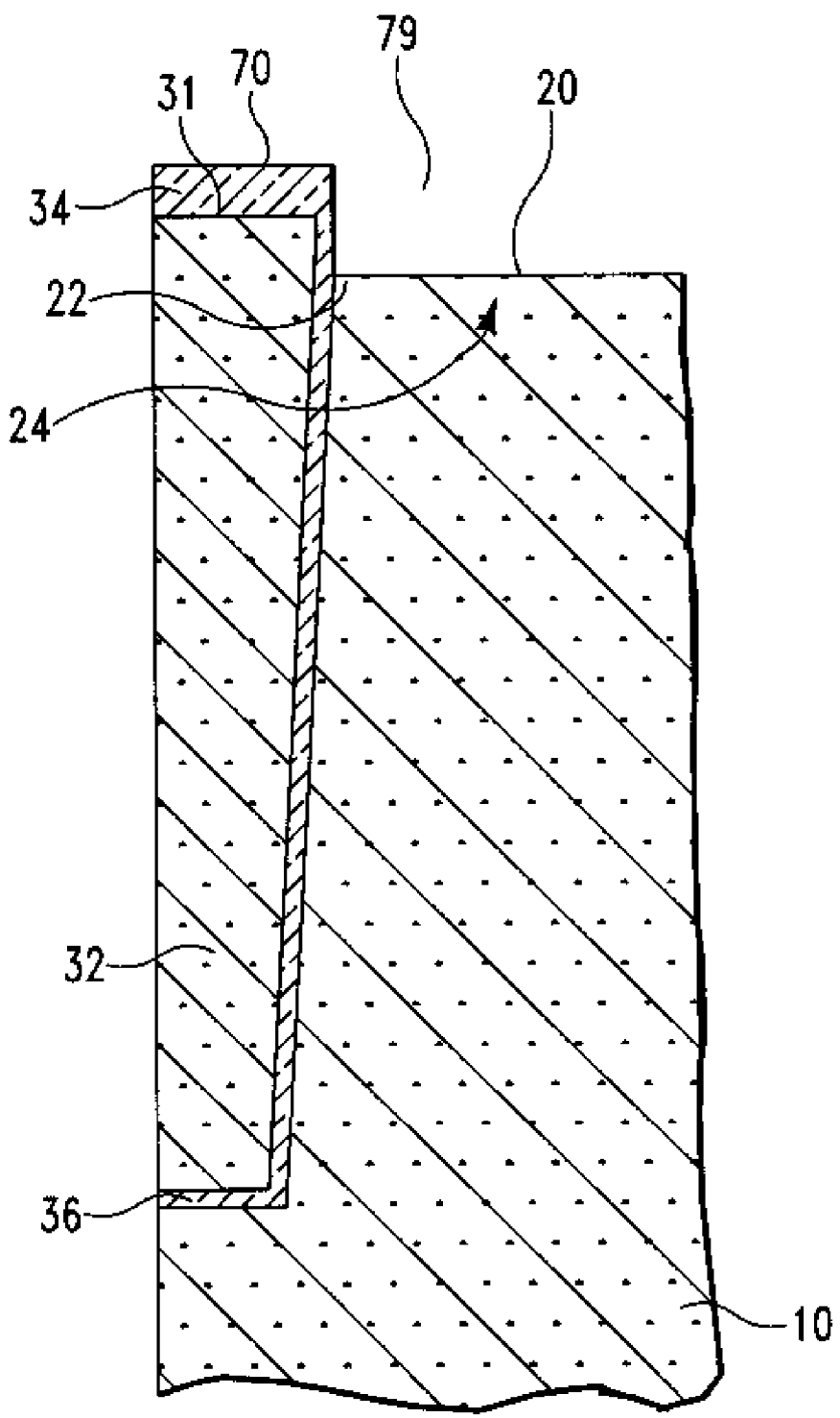

FIG. 5G illustrates a formation of a recess 79, in accordance with embodiments of the present invention. The recess 79 is formed by removing the pad structure 42. After the pad structure 42 is removed the semiconductor structure 2 of FIGS. 1 and 2 is formed by forming the, implanted wells, the gate dielectric 14 layer, the gate electrode 16, the source structure 48a and the drain structure 48b in accordance with techniques known to a person of ordinary skill in the art. An additional over-etch during patterning of the gate electrode 16 will be required to clear the extra topography introduced by having the step between the top surface 20 of channel region 24 and the top surface of the dielectric cap structure 34.

Figure 6:
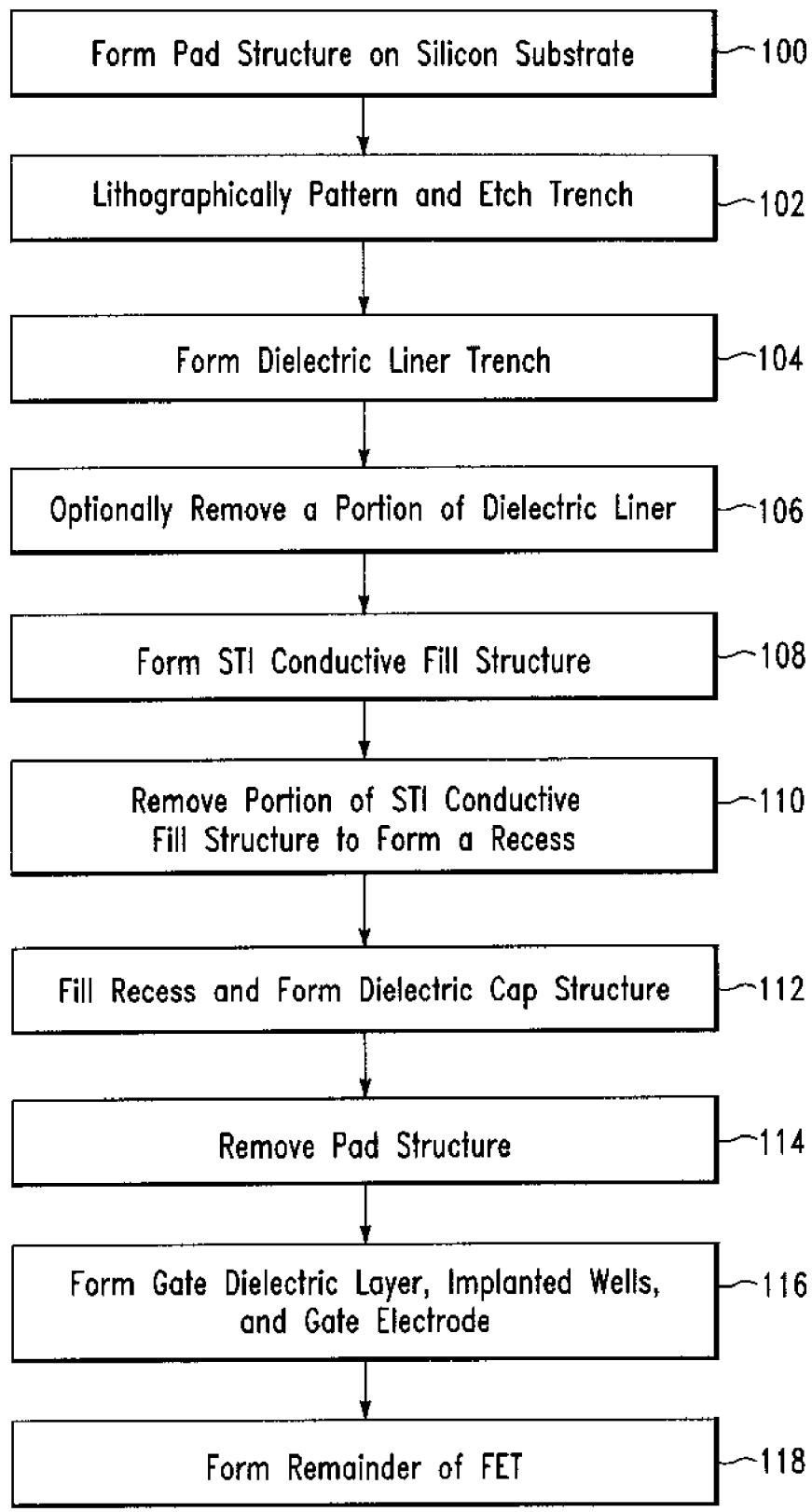
FIG. 6 illustrates a flowchart describing a process for forming the semiconductor device of FIGS. 1-5, in accordance with embodiments of the present invention.

FIG. 6 illustrates a flowchart describing a process for forming the semiconductor device of FIGS. 1-5, in accordance with embodiments of the present invention. In step 100, the pad structure 42 is formed. In step 102, a masking/etching process is used to form the shallow isolation trenches 40. Any masking/etching process using standard lithographic techniques known to a person of ordinary skill in the art may be used. In step 104, the shallow isolation trenches 40 are lined with the dielectric liner 36. In optional step 106, portions of the dielectric liner 36 are optionally removed so that the semiconductor structure 2a of FIG. 3 comprising the electrical connections 82 between the conductive STI fill structure 32 and the silicon substrate 10 may be formed. The portions of the dielectric liner 36 may be removed using, inter alia, an RIE process. In step 108, the conductive STI fill structure 32 is formed within the remaining portion of the shallow isolation trench 40 (i.e., after the dielectric liner 36 has been formed). In step 110, A recess 63 is formed within the conductive STI fill structure such that the surface 31 of the conductive STI fill structure 32 extends above the top surface 20 of the channel region 24 (i.e., within the silicon substrate 10) by the distance D that is about 1.5 to about 4 times the thickness $T_1$ of the dielectric liner 36. In step 112, the dielectric cap structure 34 is formed. In step 114, the pad structure 42 is removed. In step 116, the implanted wells, the gate dielectric 14 layer and the gate electrode 16 are formed in accordance with techniques known to a person of ordinary skill in the art. In step 118, the FET 21 is formed in accordance with techniques known to a person of ordinary skill in the art.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A method for forming a semiconductor structure, comprising:
   providing a silicon substrate;
   forming, within said a silicon substrate, a shallow trench isolation (STI) structure comprising a dielectric liner formed in a trench within said silicon substrate, a conductive STI fill structure formed over said dielectric layer, and a dielectric cap layer formed over and in contact with a top surface of said conductive STI fill structure;
   forming within said bulk silicon substrate, a first field effect transistor (FET) and a second FET, wherein said first FET comprises a channel region formed from a portion of said silicon substrate, a source structure formed adjacent to said channel region, a drain structure formed adjacent to said channel region, a gate dielectric formed over said channel region, and a gate electrode formed over said gate dielectric, wherein a bottom surface of said gate electrode is in direct physical contact with said gate dielectric, wherein said channel region comprises a first corner device and a second corner device, wherein a top surface of said channel region is located within a first plane, wherein said bottom surface of said gate electrode is located within a second plane, wherein said shallow trench isolation (STI) structure is located adjacent to and in contact with said channel region, wherein said STI structure isolates said first FET from said second FET, wherein said top surface of said conductive STI fill structure is above said first plane by a first distance $D_1$ and is above said second plane by a second distance $D_2$ that is less than $D_1$, and wherein said gate dielectric is formed over and in contact with said dielectric cap layer of said STI structure.

2. The method of claim 1, wherein said STI structure is adapted to shield said first corner device and said second corner device from a trapped electrical charge build up within said dielectric cap layer, and wherein said electrical charge build up within said dielectric cap layer is generated during operation of said first FET and said second FET over a period of time.

3. The method of claim 1, wherein said conductive STI fill structure comprises doped polysilicon.

4. The method of claim 1, wherein each of said dielectric liner and said dielectric cap layer comprise silicon dioxide.

5. The method of claim 1, wherein said first distance $D_1$ is configured to prevent a trapped electrical charge build up within said dielectric cap layer from electrically damaging said first corner device and said second corner device.

6. The method of claim 1, wherein said dielectric liner comprises a thickness T configured to prevent trapped electrical charge build up within said dielectric liner from electrically damaging said first corner device and said second corner device.

7. The method of claim 6, wherein said thickness T is in a range of about 2 nanometers to about 20 nanometers.

8. The method of claim 1, wherein said dielectric liner comprises a thickness T, and wherein said distance $D_1$ is in a range of about 1.5*T to about 4*T.

9. The method of claim 8, wherein said distance $D_1$ is in a range of about 5 nanometers to about 80 nanometers.

10. The method of claim 1, further comprising:
removing a portion of said dielectric liner prior to a formation of said conductive STI fill structure such that a bottom surface of said conductive STI fill structure is electrically connected to said bulk silicon substrate.

11. The semiconductor structure of claim 1, wherein said gate electrode is formed over said dielectric cap layer of said STI structure.

12. The semiconductor structure of claim 1, wherein said dielectric liner is formed in said trench such that said conductive STI fill structure is not in contact with said silicon substrate.

13. The semiconductor structure of claim 1, wherein said second FET comprises a second channel region formed from a second portion of said silicon substrate, and wherein said shallow trench isolation (STI) structure is located adjacent to and in contact with said second channel region.

* * * * *